US012798506B2

(12) United States Patent
Karner et al.

(10) Patent No.: US 12,798,506 B2
(45) Date of Patent: Nov. 17, 2026

(54) IGNITION RESISTANCE TEST CIRCUIT, AIRBAG CONTROLLER, AND AIRBAG

(71) Applicant: Robert Bosch GmbH, Stuttgart (DE)

(72) Inventors: Ruediger Karner, Kornwestheim (DE); Xiaofei Qiu, Jiangsu (CN)

(73) Assignee: Robert Bosch GmbH, Stuttgart (DE)

(*) Notice: Subject to any disclaimer, the term of this patent is extended or adjusted under 35 U.S.C. 154(b) by 349 days.

(21) Appl. No.: 18/307,428

(22) Filed: Apr. 26, 2023

(65) Prior Publication Data

US 2023/0347844 A1 Nov. 2, 2023

(30) Foreign Application Priority Data

Apr. 29, 2022 (CN) ........................ 202210466387.4

(51) Int. Cl.
*B60R 21/01* (2006.01)
*B60R 21/017* (2006.01)
(Continued)

(52) U.S. Cl.
CPC .......... *B60R 21/01* (2013.01); *B60R 21/0173* (2013.01); *B60R 21/16* (2013.01); *B60R 2021/01184* (2013.01); *G01R 27/08* (2013.01)

(58) Field of Classification Search
CPC ................ B60R 21/01; B60R 21/0156; B60R 21/01558; B60R 2021/335;
(Continued)

(56) References Cited

U.S. PATENT DOCUMENTS 4,825,148 A * 4/1989 McCurdy ............ B60R 21/0176 324/710
4,893,109 A * 1/1990 Vrabel ................ B60R 21/0176 340/438

(Continued)

FOREIGN PATENT DOCUMENTS

DE 19614365 C2 * 2/1999 ......... B60R 21/0173
JP H06263001 A * 9/1994

OTHER PUBLICATIONS

Karki, Jim. "Fully-differential amplifiers." (2005), Texas Instruments Incorporated, pp. 38-42. (Year: 2005).*
Translation of JP-H06263001-A (Year: 1994).*

*Primary Examiner* — Eman A Alkafawi
*Assistant Examiner* — Hugo Navarro
(74) *Attorney, Agent, or Firm* — Maginot, Moore & Beck LLP

(57) ABSTRACT

An ignition resistance test circuit for an airbag is disclosed. The test circuit includes (i) an ignition resistor, (ii) a current source circuit for providing a test current for testing the ignition resistor, (iii) a current drain circuit for receiving the test current, (iv) a differential amplification circuit for differentially amplifying the voltage at the two ends of the ignition resistor, thus obtaining a voltage drop after differential amplification, and (v) an analogue-to-digital conversion circuit for performing analogue-to-digital conversion of the differentially amplified voltage drop to provide to a control unit, enabling the control unit to determine the resistance value of the ignition resistor based on the voltage drop and the test current. An airbag controller and an airbag is also disclosed.

8 Claims, 2 Drawing Sheets

(51) Int. Cl.
*B60R 21/16* (2006.01)
*G01R 27/08* (2006.01)

(58) Field of Classification Search
CPC ... B60R 2021/01115; B60R 2021/0104; B60R 2021/01068; G01R 27/08; G01R 31/008; G01R 31/007; G01R 31/006; G01R 31/005; G01R 27/02; B06R 21/0173; B06R 21/16
USPC .......................................................... 324/503
See application file for complete search history.

(56) References Cited

U.S. PATENT DOCUMENTS

| | | | | | |
|---|---|---|---|---|---|
| 5,181,011 | A * | 1/1993 | Okano | B60R 21/0173 | 340/436 |
| 5,187,465 | A * | 2/1993 | Stonerook | B60R 21/0176 | 307/10.1 |
| 5,268,643 | A * | 12/1993 | Aso | B60R 21/0173 | 73/865.9 |
| 5,612,623 | A * | 3/1997 | Watanabe | G01R 31/2829 | 324/711 |
| 5,872,460 | A * | 2/1999 | Bennett | G01R 31/2829 | 324/762.09 |
| 7,898,268 | B2 * | 3/2011 | Bernardon | G01R 27/14 | 324/548 |
| 11,208,067 | B2 * | 12/2021 | Hayashi | H02J 7/345 | |
| 2022/0118930 | A1 * | 4/2022 | Sudhaus | G05F 1/56 | |

* cited by examiner

IGNITION RESISTANCE TEST CIRCUIT, AIRBAG CONTROLLER, AND AIRBAG

This application claims priority under 35 U.S.C. § 119 to application no. CN 202210466387.4, filed on Apr. 29, 2022 in China, the disclosure of which is incorporated herein by reference in its entirety.

The present disclosure relates to the field of control of airbags, and more specifically, to an ignition resistance test circuit, an airbag controller, and an airbag.

BACKGROUND

With the development of motorways and the improvement of vehicle performance, vehicles are capable of travelling faster and faster, and, especially, due to traffic congestion caused by a rapid increase in private cars, accidents occur more frequently, so vehicle safety has become particularly important. Vehicle safety may be active or passive, wherein active safety refers to the ability of a vehicle to prevent accidents, mainly involving operational stability, braking performance, smoothness, etc.; passive safety refers to the ability of a vehicle to protect a vehicle occupant in the event of a serious accident, which mainly involves a seat belt, seat cushion, anti-collision body, airbag protection system, etc.

The most important indicator of an airbag is reliability, wherein ignition triggered when it should not be, causing the airbag to deploy, is called misignition, ignition not triggered when it should be is called omitted ignition, and ignition triggered too late is called late ignition, and none of misignition, omitted ignition, or late ignition is allowable. As one of the tests for an airbag, it is necessary to conduct an ignition resistance test on the airbag to ensure that ignition is triggered in a timely and accurate manner for airbag deployment.

However, with existing airbag electronic controller units (ECUs), the accuracy of ignition resistance measurement is relatively low. Moreover, in order to ensure high accuracy, it is generally necessary to measure ignition resistance twice (for example, once at the high-side power stage and once again at the low-side power stage), so the measurement takes long and a large energy-storage capacitor is needed, which is unfavourable for circuit layout design.

SUMMARY

According to one aspect of the present disclosure, an ignition resistance test circuit for an airbag is provided, the test circuit comprising: an ignition resistor; a current source circuit for providing a test current for testing the ignition resistor; a current drain circuit for receiving the test current; a differential amplification circuit for differentially amplifying the voltage at the two ends of the ignition resistor, thus obtaining a voltage drop after differential amplification; and an analogue-to-digital conversion circuit for performing analogue-to-digital conversion of the differentially amplified voltage drop to provide to a control unit, enabling the control unit to determine the resistance value of the ignition resistor based on the voltage drop and the test current.

As a supplement to or a replacement for the above-described solution, the above-described test circuit may further comprise: an electrostatic protection capacitor for suppressing electrostatic discharge voltage.

As a supplement to or a replacement for the above-described solution, the electrostatic protection capacitor in the test circuit comprises: a first protective capacitor coupled between the ignition resistor and the current source circuit; and a second protective capacitor coupled between the ignition resistor and the current drain circuit.

As a supplement to or a replacement for the above-described solution, the above-described test circuit may further comprise: a first direct-current biasing circuit connected between the current source circuit and the differential amplification circuit; and a second direct-current biasing circuit connected between the current drain circuit and the differential amplification circuit.

As a supplement to or a replacement for the above-described solution, the differential amplification circuit in the above-described test circuit comprises: a first resistor; a second resistor; a third resistor; a fourth resistor; and an amplification unit, wherein a first end of the first resistor is connected to a first end of the ignition resistor; a second end of the first resistor is connected to a first input terminal of the amplification unit; a first end of the second resistor is connected to a second end of the ignition resistor; a second end of the second resistor is connected to a second input terminal of the amplification unit; a first end of the third resistor is connected to the second input terminal of the amplification unit; a second end of the third resistor is connected to the ground; a first end of the fourth resistor is connected to the second input terminal of the amplification unit; a second end of the fourth resistor is connected to an output terminal of the amplification unit.

As a supplement to or a replacement for the above-described solution, in the above-described test circuit, the output terminal of the amplification unit is coupled to the analogue-to-digital conversion circuit.

As a supplement to or a replacement for the above-described solution, in the above-described test circuit, the resistance values of the first resistor, the second resistor, the third resistor, and the fourth resistor are equal.

According to another aspect of the present disclosure, an airbag controller is provided, comprising a test circuit as described above and a control unit for determining the resistance value of the ignition resistor based on a voltage drop and a test current provided by the test circuit.

According to another aspect of the present disclosure, an airbag is provided, comprising a controller as described above.

The ignition resistance test circuit of an airbag according to an embodiment of the present disclosure is integrated with a differential amplification circuit, which makes it possible to measure a differential voltage between the high-side power stage and the low-side power stage, thereby completing a one-time measurement of the ignition resistance. Moreover, the analogue-to-digital conversion circuit performs analogue-to-digital conversion of the differentially amplified voltage drop to provide to a control unit, enabling the control unit to determine the resistance value of the ignition resistor based on the voltage drop and the test current, which eliminates any difference in two measurements of voltage at the low-side power stage and at the high-side power stage, beneficially improving the accuracy of the ignition resistance test. In addition, as ignition resistance needs to be measured only once, ignition resistance measurement time is effectively shortened, software load is reduced, and the size of the energy-storage capacitor may be reduced.

BRIEF DESCRIPTION OF THE DRAWINGS

The following detailed description in conjunction with the drawings will provide a fuller and clearer understanding of the above-described and other objectives and advantages of the present disclosure, wherein identical or similar elements are denoted by identical reference signs.

DETAILED DESCRIPTION

Figure 1:
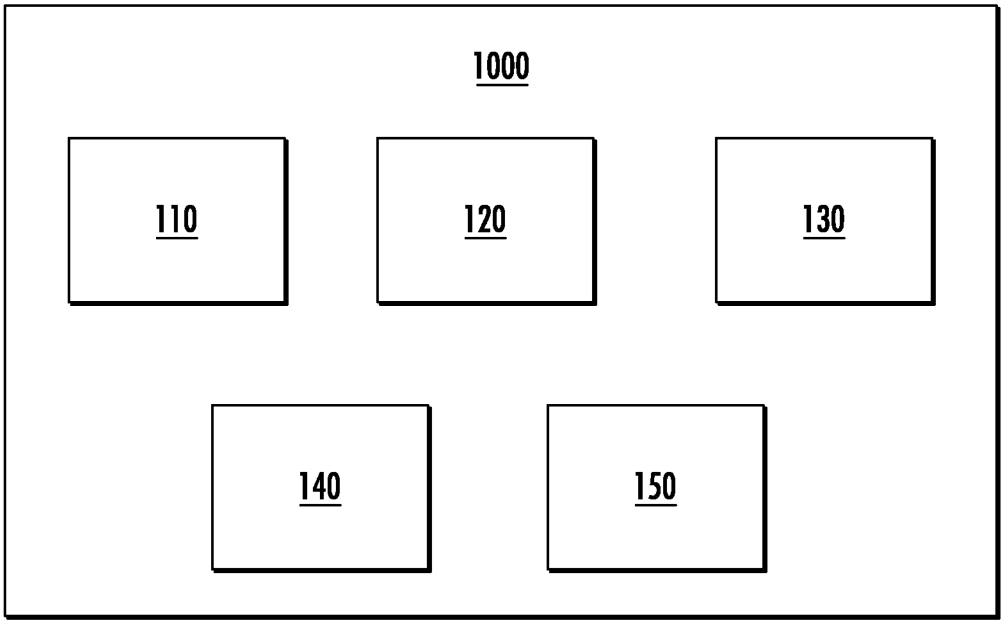
FIG. 1 is a structural schematic diagram of the ignition resistance test circuit of an airbag according to an embodiment of the present disclosure.

Airbag control solutions according to various exemplary embodiments of the present disclosure will be described in detail below with reference to the drawings. FIG. 1 is a structural schematic diagram of the ignition resistance test circuit 1000 of an airbag according to an embodiment of the present disclosure.

As shown in FIG. 1, the ignition resistance test circuit 1000 of the airbag comprises: an ignition resistor 110, a current source circuit 120, a current drain circuit 130, a differential amplification circuit 140, and an analogue-to-digital conversion circuit 150. The current source circuit 120 is configured to provide a test current for testing the ignition resistor 110; the current drain circuit 130 is configured to receive the test current; the differential amplification circuit 140 is configured to perform differential amplification of the voltage at the two ends of the ignition resistor 110, thereby obtaining a voltage drop after differential amplification; the analogue-to-digital conversion circuit 150 is configured to perform analogue-to-digital conversion of the differentially amplified voltage drop to provide to a control unit (not shown in FIG. 1), enabling the control unit to determine the resistance value of the ignition resistor 110 based on the voltage drop and the test current.

In the context of the present disclosure, "testing the ignition resistance of an airbag" is intended to accurately measure the resistance value of the ignition resistor, so that the energy-storage capacitor provides sufficient energy when ignition is needed, ensuring that ignition is triggered in a timely and accurate manner for airbag deployment.

In one embodiment, although not shown in FIG. 1, the test circuit 1000 may further comprise: an electrostatic protection capacitor for suppressing electrostatic discharge voltage. For example, an electrostatic protection capacitor may comprise: a first protective capacitor coupled between the ignition resistor and the current source circuit; and a second protective capacitor coupled between the ignition resistor and the current drain circuit.

In one embodiment, the test circuit 1000 may further comprise: a first direct-current biasing circuit connected between the current source circuit and the differential amplification circuit; and a second direct-current biasing circuit connected between the current drain circuit and the differential amplification circuit.

In one embodiment, the differential amplification circuit 140 may specifically comprise: a first resistor; a second resistor; a third resistor; a fourth resistor; and an amplification unit. A first end of the first resistor is connected to a first end of the ignition resistor; a second end of the first resistor is connected to a first input terminal of the amplification unit; a first end of the second resistor is connected to a second end of the ignition resistor; a second end of the second resistor is connected to a second input terminal of the amplification unit; a first end of the third resistor is connected to the second input terminal of the amplification unit; a second end of the third resistor is connected to the ground; a first end of the fourth resistor is connected to the second input terminal of the amplification unit; a second end of the fourth resistor is connected to an output terminal of the amplification unit. In the above-described embodiment, an output terminal of the amplification unit may be coupled to the analogue-to-digital conversion circuit 150.

In one or more embodiments, in the test circuit 1000, the resistance values of the first resistor, the second resistor, the third resistor, and the fourth resistor may be equal. In another embodiment, the resistance values of the first resistor, the second resistor, the third resistor, and the fourth resistor may be partially equal or completely different. Those of ordinary skill in the art understand that by rationally setting the resistance values of the first resistor, the second resistor, the third resistor, and the fourth resistor, the differential amplification circuit 140 may be designed as a circuit with an expected amplification coefficient.

Figure 2:
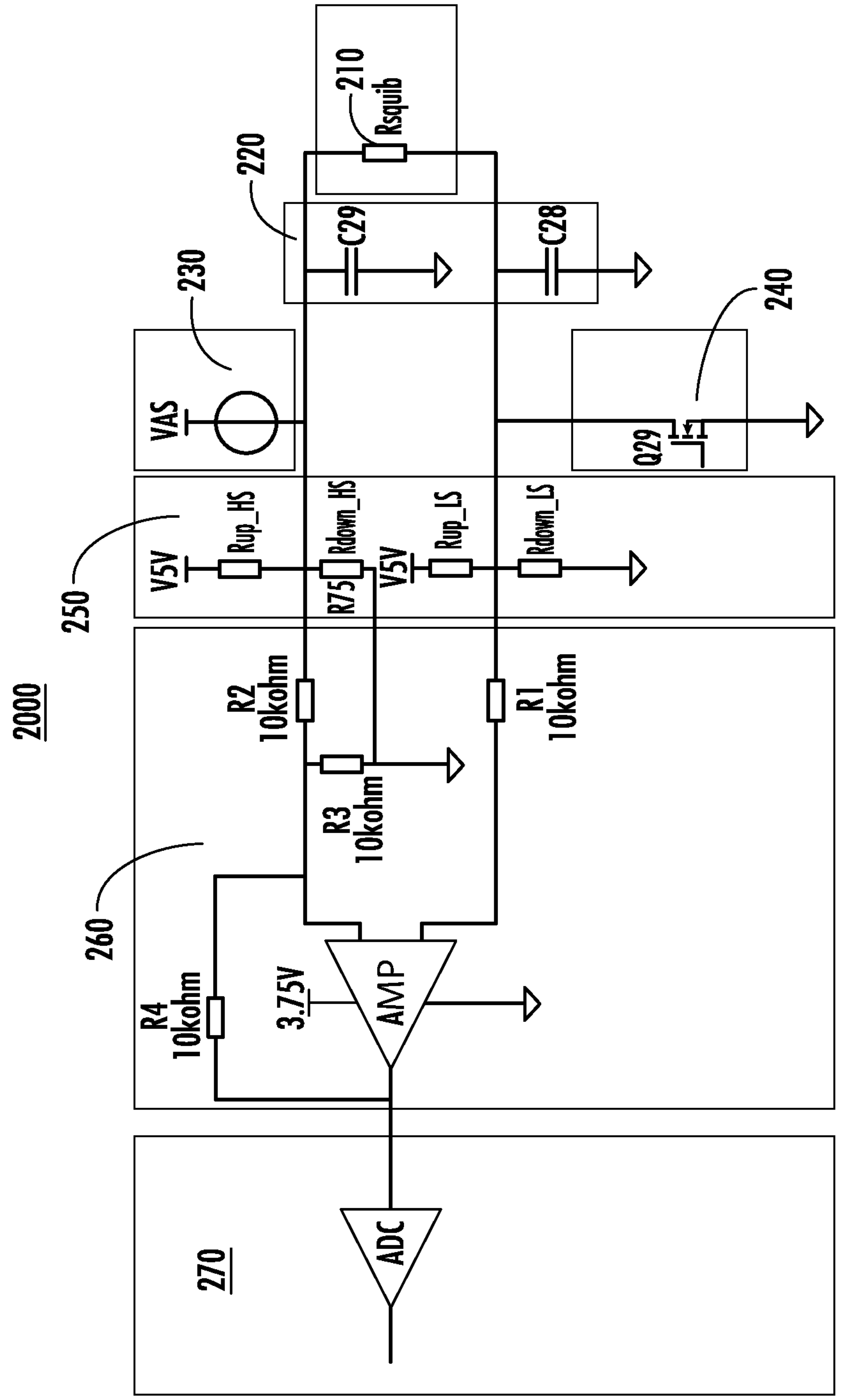
FIG. 2 is a structural schematic diagram of the ignition resistance test circuit for an airbag according to another embodiment of the present disclosure.

Refer to FIG. 2, which is a structural schematic diagram of the ignition resistance test circuit 2000 of an airbag according to another embodiment of the present disclosure. As shown in FIG. 2, the ignition resistance test circuit 2000 of the airbag comprises: an ignition resistor 210, an electrostatic protection capacitor 220, a current source circuit 230, a current drain circuit 240, a direct-current biasing circuit 250, a differential amplification circuit 260, and an analogue-to-digital conversion circuit 270.

In one or more embodiments, the ignition resistor 210 has a resistance value of 0-1 kilo ohms, wherein if the resistance value of the ignition resistor 210 is too large, normal use of the airbag of the vehicle will be affected, while the fault indicator lamp of the airbag goes on. In the event of a collision, the airbag of a vehicle can cushion a portion of the impact exerted on a vehicle occupant, preventing any impact or impact-caused injuries between the flailing occupant and the interior of the vehicle. The airbag of a vehicle can effectively improve the personal safety of the vehicle's occupants, wherein, in the event of a severe collision, an airbag can reduce the probability of head injury by 25% and that of facial injury by 80% in a vehicle occupant.

The electrostatic protection capacitor 220 is configured to suppress an electrostatic discharge current. In one embodiment, as shown in FIG. 2, the electrostatic protection capacitor 220 comprises a first protective capacitor C29, of which one end is coupled to a first end of the ignition resistor 210 and the other end is coupled to the ground. The electrostatic protection capacitor 220 may further comprise a second protective capacitor C28, of which one end is coupled to a second end of the ignition resistor 210 and the other end is coupled to the ground.

The current source circuit 230 is configured to provide a test current for testing the ignition resistor 210. In FIG. 2, the current source circuit 230 is coupled to a first end of the ignition resistor 210. In one embodiment, the current source circuit 230 is a current source that provides a 40 mA output.

The current drain circuit 240 is configured to receive a test current flowing through the ignition resistor 210. As shown in FIG. 2, the current drain circuit 240 is coupled to a second end of the ignition resistor 210. In one or more embodiments, the current drain circuit 240 may be a MOS transistor.

With continued reference to FIG. 2, the direct-current biasing circuit 250 may comprise: a first direct-current biasing circuit connected between the current source circuit 230 and the differential amplification circuit 260; and a second direct-current biasing circuit is connected between the current drain circuit 240 and the differential amplification circuit 260.

The first direct-current biasing circuit (namely the high-side direct-current biasing circuit) comprises a first pull-up resistor $R_{up\_HS}$ and a first pull-down resistor $R_{down\_HS}$, wherein a first end of the first pull-up resistor $R_{up\_HS}$ is coupled to a voltage input terminal (5 V) and a second end thereof is coupled to a first end of the ignition resistor 210; a first end of the first pull-down resistor $R_{down\_HS}$ is coupled to a second end of the first pull-up resistor $R_{up\_HS}$, and a second end of the first pull-down resistor $R_{down\_HS}$ is coupled to the ground. In one embodiment, the resistance value of the first pull-up resistor $R_{up\_HS}$ is 15 k ohms, and the resistance value of the first pull-down resistance $R_{down\_HS}$ is 5 k ohms.

The second direct-current biasing circuit (namely the low-side direct-current biasing circuit) comprises a second pull-up resistor $R_{up\_LS}$ and a second pull-down resistor $R_{down\_LS}$, wherein a first end of the second pull-up resistor $R_{up\_LS}$ is coupled to a voltage input terminal (5 V) and a second end thereof is coupled to a second end of the ignition resistor 210; a first end of the second pull-down resistor $R_{down\_LS}$ is coupled to a second end of the second pull-up resistor $R_{up\_LS}$ and a second end of the second pull-down resistor $R_{down\_LS}$ is coupled to the ground. In one embodiment, the resistance value of the second pull-up resistor $R_{up\_LS}$ is 15 k ohms, and the resistance value of the second pull-down resistor $R_{down\_LS}$ is 5 k ohms.

The differential amplification circuit 260 is configured to differentially amplify the voltage at the two ends of the ignition resistor 210, thereby obtaining a voltage drop after differential amplification. In the embodiment shown in FIG. 2, the differential amplification circuit 260 comprises a first resistor R1, a second resistor R2, a third resistor R3, a fourth resistor R4, and an amplification unit AMP. A first end of the first resistor R1 is coupled to a second end of the second pull-up resistor $R_{up\_LS}$ in the second direct-current biasing circuit, and a second end of the first resistor R1 is coupled to a second input terminal of the amplification unit AMP. A first end of the second resistor R2 is coupled to a first input terminal of the amplification unit AMP, and a second end of the second resistor R2 is coupled to a second end of the first pull-up resistor $R_{up\_HS}$. A first end of the third resistor R3 is coupled to a first end of the second resistor R2, and a second end of the third resistor R3 is coupled to the ground. A first end of the fourth resistor R4 is coupled to an output terminal of the amplification unit AMP, and a second end of the fourth resistor R4 is coupled to a first input terminal of the amplification unit AMP.

The analogue-to-digital conversion circuit 270 is configured to perform analogue-to-digital conversion of the differentially amplified voltage drop to provide to a control unit (not shown in FIG. 2). In one embodiment, the control unit is located in the airbag controller together with the ignition resistance test circuit, and determines the resistance value of the ignition resistor based on the voltage drop and the test current provided by the ignition resistance test circuit.

In one or more embodiments, the above-mentioned airbag controller may be integrated into various types of airbags, which is not limited in the present disclosure.

In summary, the ignition resistance test circuit of an airbag according to an embodiment of the present disclosure is integrated with a differential amplification circuit, which makes it possible to measure a differential voltage between the high-side power stage and the low-side power stage, thereby completing a one-time measurement of the ignition resistance. Moreover, the analogue-to-digital conversion circuit performs analogue-to-digital conversion of the differentially amplified voltage drop to provide to a control unit, enabling the control unit to determine the resistance value of the ignition resistor based on the voltage drop and the test current, which eliminates any difference in two measurements of voltage at the low-side power stage and at the high-side power stage, beneficially improving the accuracy of the ignition resistance test. In addition, as ignition resistance needs to be measured only once, ignition resistance measurement time is effectively shortened, software load is reduced, and the size of the energy-storage capacitor may be reduced.

Although only some embodiments of the present disclosure have been described above, those of ordinary skill in the art should understand that the present disclosure may be implemented in many other forms without departing from its spirit or scope. Therefore, the examples and embodiments described herein are construed as illustrative rather than restrictive and, without departing from the spirit or scope of the present disclosure as defined by the attached claims, the present disclosure may cover various modifications and substitutions.

What is claimed is:

1. An ignition resistance test circuit for an airbag, comprising:

an ignition resistor;

a current source circuit configured to provide a predetermined test current for testing the ignition resistor;

a current drain circuit configured to receive the predetermined test current, the current drain circuit having a first end and a second end, the second end being connected to a ground;

a differential amplification circuit configured to differentially amplify a voltage at two ends of the ignition resistor so as to obtain a voltage drop after differential amplification;

a first direct-current biasing circuit having a first pull-up resistor and a first pull-down resistor, the first pull-up resistor having a first end connected to a voltage input terminal, the first pull-up resistor having a second end connected between the first end of the current source circuit and the differential amplification circuit, the first pull-down resistor having a first end connected directly to the second end of the first pull-up resistor, the first pull-down resistor having a second end connected to the ground;

a second direct-current biasing circuit having a second pull-up resistor and a second pull-down resistor, the second pull-up resistor having a first end connected to the voltage input terminal, the second pull-up resistor having a second end connected between the current drain circuit and the differential amplification circuit, the second pull-down resistor having a first end connected directly to the second end of the second pull-up resistor, the second pull-down resistor having a second end connected to the ground; and an analogue-to-digital conversion circuit configured to perform analogue-to-digital conversion of the voltage drop after the differential amplification to provide to a control unit, enabling the control unit to determine a resistance value of the ignition resistor based on the voltage drop and the predetermined test current.

2. The ignition resistance test circuit according to claim 1, further comprising:

an electrostatic protection capacitor connected to the ignition resistor and configured to suppress an electrostatic discharge current.

3. The ignition resistance test circuit according to claim 2, wherein the electrostatic protection capacitor comprises:

a first protective capacitor having (i) a first end connected between a first end of the ignition resistor and the current source circuit and (ii) a second end connected to the ground; and a second protective capacitor having (i) a first end connected between a second end of the ignition resistor and the current drain circuit and (ii) a second end connected to the ground.

4. The ignition resistance test circuit according to claim 1, wherein the differential amplification circuit including (i) an amplifier, (ii) a first resistor having a first end connected to a first end of the ignition resistor and having a second end connected to a first input terminal of the amplifier, (iii) a second resistor having a first end connected to a second end of the ignition resistor and having a second end connected to a second input terminal of the amplifier, (iv) a third resistor having a first end connected to the second input terminal of the amplifier and having a second end connected to a ground, and (v) a fourth resistor having a first end connected to the second input terminal of the amplifier and having a second end connected to an output terminal of the amplifier.

5. The ignition resistance test circuit according to claim 4, wherein the output terminal of the amplifier is coupled to the analogue-to-digital conversion circuit.

6. The ignition resistance test circuit according to claim 4, wherein resistance values of the first resistor, the second resistor, the third resistor, and the fourth resistor are equal.

7. An airbag controller, comprising:

the ignition resistance test circuit according to claim 1; and the control unit configured to determine the resistance value of the ignition resistor based on the voltage drop and the predetermined test current provided by the test circuit.

8. An airbag, comprising an airbag controller according to claim 7.

* * * * *